(12) United States Patent
Pajkic et al.

(10) Patent No.: US 12,176,444 B2
(45) Date of Patent: Dec. 24, 2024

(54) OPTOELECTRONIC COMPONENT AND METHOD FOR PRODUCING SAME

(71) Applicant: OSRAM Opto Semiconductors GmbH, Regensburg (DE)

(72) Inventors: Zeljko Pajkic, Regensburg (DE); Michael Müller, Garching (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 771 days.

(21) Appl. No.: 17/279,050

(22) PCT Filed: Oct. 10, 2019

(86) PCT No.: PCT/EP2019/077523
§ 371 (c)(1),
(2) Date: Mar. 23, 2021

(87) PCT Pub. No.: WO2020/074664
PCT Pub. Date: Apr. 16, 2020

(65) Prior Publication Data
US 2022/0045224 A1     Feb. 10, 2022

(30) Foreign Application Priority Data
Oct. 11, 2018 (DE) .................. 10 2018 125 127.0

(51) Int. Cl.
*H01L 31/0203* (2014.01)
*H01L 33/48* (2010.01)
(Continued)

(52) U.S. Cl.
CPC ........ *H01L 31/0203* (2013.01); *H01L 33/483* (2013.01); *H01L 33/54* (2013.01); *H01S 5/02315* (2021.01); *H01L 2933/005* (2013.01)

(58) Field of Classification Search
CPC .................. H01L 31/0203; H01L 33/483
See application file for complete search history.

(56) References Cited

U.S. PATENT DOCUMENTS

| 2009/0134408 A1* | 5/2009 | Park | ................. | H01L 25/0753 |
|---|---|---|---|---|
| | | | | 257/E33.056 |
| 2012/0217614 A1* | 8/2012 | Burgyan | ............... | H01L 23/552 |
| | | | | 257/532 |

(Continued)

FOREIGN PATENT DOCUMENTS

| DE | 10041328 B4 | 3/2002 |
| DE | 102011113483 A1 | 3/2013 |

(Continued)

OTHER PUBLICATIONS

International Search Report and Written Opinion issued for PCT/EP2019/077523 issued Dec. 20, 2019.

*Primary Examiner* — Jay C Chang
*Assistant Examiner* — Mikka Liu
(74) *Attorney, Agent, or Firm* — ArentFox Schiff LLP

(57) ABSTRACT

The invention relates to an optoelectronic component comprising a carrier, an optoelectronic semiconductor chip arranged on the upper side of the carrier, and a frame which is arranged on the upper side of the carrier and which frames the optoelectronic semiconductor chip. An underside of the frame, which faces the upper side of the carrier, has at least one recess. In a spatial area framed by the frame on the upper side of the carrier, there is arranged a potting material which is in contact with the frame and at least partly fills the recess in the frame.

22 Claims, 6 Drawing Sheets

(51) Int. Cl.
 *H01L 33/54* (2010.01)
 *H01S 5/02315* (2021.01)

(56) References Cited

U.S. PATENT DOCUMENTS

| | | | |
|---|---|---|---|
| 2013/0001629 A1 | 1/2013 | Chen et al. | |
| 2014/0334137 A1 | 11/2014 | Hasenoehrl et al. | |
| 2016/0240747 A1* | 8/2016 | Pindl | H01L 33/483 |
| 2018/0114734 A1* | 4/2018 | Wang | H01L 24/26 |

FOREIGN PATENT DOCUMENTS

| | | |
|---|---|---|
| DE | 102016101719 A1 | 8/2017 |
| WO | 2017134029 A1 | 8/2017 |

\* cited by examiner

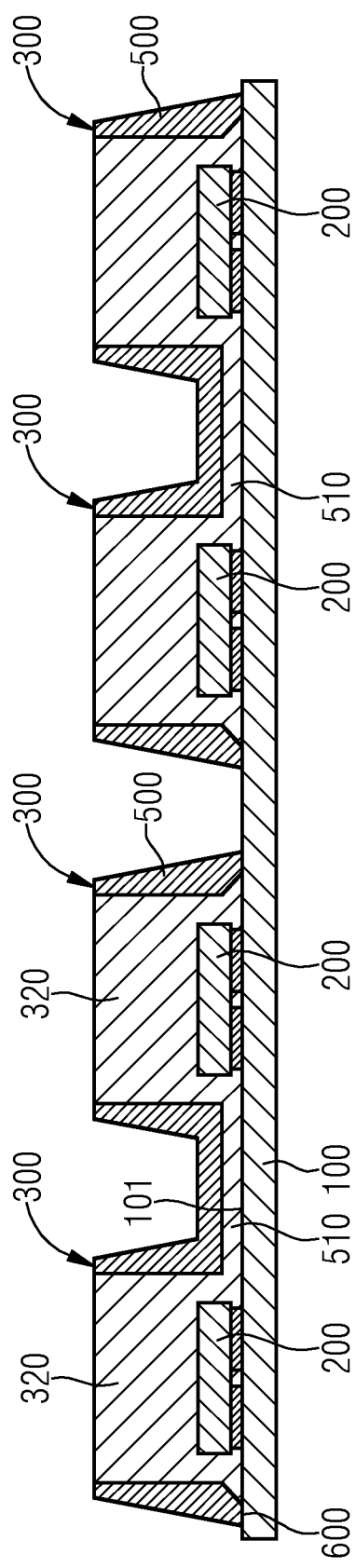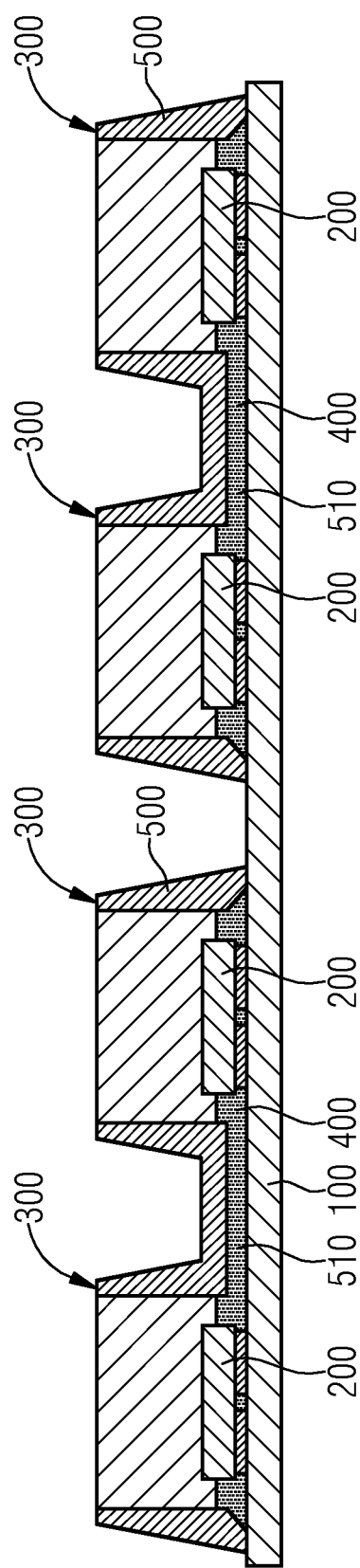

OPTOELECTRONIC COMPONENT AND METHOD FOR PRODUCING SAME

The present disclosure is a national stage application of International Patent Application No. PCT/EP2019/077523, which was filed on Oct. 10, 2019 and that claims the priority and the benefit of German Patent Application DE 10 2018 125 127.0, the contents of which are incorporated here by reference in their entireties.

The present invention relates to an optoelectronic component and to a method for producing an optoelectronic component.

This patent application claims the priority of German Patent Application DE 10 2018 125 127.0, the disclosure content of which is incorporated here by reference.

Optoelectronic components which comprise a frame arranged on an upper side of a carrier are known from the prior art. The frame may, for example, be used to protect an optoelectronic semiconductor chip of the optoelectronic component and to mount further constituent parts of the optoelectronic component.

It is an object of the present invention to provide an optoelectronic component. It is a further object of the present invention to specify a method for producing an optoelectronic component. These objects are achieved by an optoelectronic component and by a method for producing an optoelectronic component, which have the features of the independent claims. Various refinements are specified in the dependent claims.

An optoelectronic component comprises a carrier, an optoelectronic semiconductor chip arranged on an upper side of the carrier, and a frame, which is arranged on the upper side of the carrier and borders the optoelectronic semiconductor chip. A lower side, facing toward the upper side of the carrier, of the frame comprises at least one recess. The lower side of the frame is fastened on the upper side of the carrier by means of an adhesive. In a spatial region, bordered by the frame, on the upper side of the carrier, an encapsulation material is arranged, is in contact with the frame and at least partially fills the recess of the frame.

Advantageously, the frame of this optoelectronic component is held on the carrier by the encapsulation compound. Since the encapsulation compound is in contact with the frame and at least partially fills the recess of the frame, a particularly robust connection is obtained between the encapsulation material and the frame, and therefore also between the frame and the carrier of the optoelectronic component. This makes it possible to configure a contact area between the lower side of the frame and the upper side of the carrier so that it is small. In this way, the optoelectronic component can have compact external dimensions overall. Since the frame of this optoelectronic component borders the optoelectronic semiconductor chip, the frame may provide protection of the optoelectronic semiconductor chip against damage by external influences.

Advantageously, the adhesive also achieves fixing of the frame on the upper side of the carrier. In particular, the adhesive may fix the frame on the upper side of the carrier during the production of the optoelectronic component, before the encapsulation material is arranged on the upper side of the carrier, in the spatial region bordered by the frame. The additional fixing of the frame on the carrier, achieved by the encapsulation material, advantageously makes it possible to configure the area of the adhesive bond between the frame and the carrier so that it is small.

In one embodiment of the optoelectronic component, the recess forms a cutout between the spatial region bordered by the frame and an outer side of the frame. Advantageously, a particularly large contact area is thereby obtained between the frame of the optoelectronic component and the encapsulation material arranged on the upper side of the carrier, with at the same time particularly compact external dimensions of the frame and of the carrier.

In one embodiment of the optoelectronic component, no adhesive is arranged in the region of the recess. In one embodiment of the optoelectronic component, the frame is even fastened on the upper side of the carrier by means of the adhesive only in four corner regions. Advantageously, this configuration makes it possible to form the optoelectronic component with particularly compact external dimensions.

In one embodiment of the optoelectronic component, the frame comprises an anchoring structure, by which the encapsulation material is anchored on the frame. In this case, the anchoring structure comprises roughening, an indentation or a projection. In particular, the anchoring structure may comprise an indentation or a projection having an undercut. Advantageously, the presence of the anchoring structure leads to a particularly stable connection between the encapsulation material and the frame. In this way, the frame is held particularly stably on the carrier of the optoelectronic component.

In one embodiment of the optoelectronic component, an optical element is mounted on the frame. The optical element may for example be an optical lens, a Fresnel optical element, a metaoptical element or a diffractive optical element. Mounting of the optical element on the frame of the optoelectronic component advantageously leads to a defined position of the optical element relative to the optoelectronic semiconductor chip of the optoelectronic component. In this way, advantageously, no additional element is required for mounting the optical element.

In one embodiment of the optoelectronic component, the frame comprises a filling opening, which extends from an outer side of the frame through a wall of the frame to the spatial region bordered by the frame. Advantageously, the filling opening allows simple and reliable introduction of the encapsulation material. For example, the encapsulation material may be introduced through the filling opening into the spatial region bordered by the frame by means of a dispensing needle.

In one embodiment of the optoelectronic component, the optoelectronic semiconductor chip is embedded into the encapsulation material. In this way, the encapsulation material may advantageously provide protection of the optoelectronic semiconductor chip against damage by external influences. The encapsulation material may also be used as a reflector or to increase a contrast between the optoelectronic semiconductor chip and the environment of the optoelectronic semiconductor chip.

In one embodiment of the optoelectronic component, the optoelectronic semiconductor chip is not fully covered by the encapsulation material. In this way, for example, it is possible to prevent electromagnetic radiation emitted by the optoelectronic semiconductor chip being shadowed or absorbed by the encapsulation material.

In one embodiment of the optoelectronic component, the frame comprises an intermediate wall, which subdivides the spatial region bordered by the frame. In this way, the optoelectronic component comprises a plurality of cavities, which may fulfill different purposes. For example, the plurality of cavities of the optoelectronic component may accommodate a plurality of optoelectronic semiconductor chips.

In one embodiment of the optoelectronic component, a different encapsulation material is arranged in one part of the spatial region bordered by the frame than in another part of the spatial region bordered by the frame. In this way, the plurality of cavities of an optoelectronic component comprising a plurality of cavities may be optimized separately from one another for their respective application purpose.

A method for producing an optoelectronic component comprises steps of arranging an optoelectronic semiconductor chip on an upper side of a carrier, of providing a frame having a lower side which comprises a recess, of arranging the frame on the upper side of the carrier in such a way that the lower side of the frame faces toward the upper side of the carrier and the frame borders the optoelectronic semiconductor chip, the lower side of the frame being fastened on the upper side of the carrier by means of an adhesive, and of arranging an encapsulation material in a spatial region, bordered by the frame, on the upper side of the carrier, in such a way that the encapsulation material is in contact with the frame and at least partially fills the recess of the frame.

Advantageously, the frame of the optoelectronic component is fixed on the upper side of the carrier by the encapsulation material during this production method. Because the frame comprises a recess, which is at least partially filled by the encapsulation material, a particularly large contact area is obtained between the encapsulation material and the frame, as a result of which a particularly stable connection is obtained between the encapsulation material and the frame, and therefore also between the frame and the carrier. The frame of the optoelectronic component obtainable by the method may, for example, be used to protect the optoelectronic semiconductor chip against damage by external influences.

The adhesive may advantageously achieve additional fixing of the frame on the upper side of the carrier. In particular, the adhesive may fix the frame during the production of the optoelectronic component before the encapsulation material is arranged on the upper side of the carrier.

In one embodiment of the method, it comprises a further step of removing a part of the frame. In this way, the optoelectronic component obtainable by the method advantageously has particularly compact external dimensions.

The removal of a part of the frame may be made possible by the additional fixing of the frame on the carrier and the additional stabilization of the frame which are achieved by the encapsulation material arranged in the frame.

In one embodiment of the method, the part of the frame is removed in such a way that a cutout is formed between the spatial region bordered by the frame and an outer side of the frame in the region of the recess. In this way, the optoelectronic component obtainable by the method advantageously has particularly compact external dimensions.

In one embodiment of the method, the frame is provided as a panel comprising further frames. In this case, the panel is divided after the encapsulation material has been arranged. Advantageously, the method therefore allows simultaneous production of a multiplicity of optoelectronic components. In this way, the production costs per optoelectronic component and the working time required for the production of an optoelectronic component are reduced.

In one embodiment of the method, no adhesive is arranged in the region of the recess. Since the frame is subsequently additionally held on the carrier by the encapsulation material, the area of the contact region provided with adhesive between the frame and the carrier can advantageously be minimized. In particular, this makes it possible to dispense with the provision of adhesive in the region of the recess. This advantageously makes it possible to use the part of the surface of the carrier in the region of the recess of the frame for other purposes, for example for electrical contact pads or for electrical conductor tracks.

In one embodiment of the method, the frame is fastened on the upper side of the carrier by means of the adhesive only in four corner regions. Advantageously, the optoelectronic component obtainable by the production method then has particularly compact external dimensions.

In one embodiment of the method, the frame comprises a filling opening, which extends from an outer side of the frame through a wall of the frame to the spatial region bordered by the frame. In this case, the encapsulation material is delivered through the filling opening. Advantageously, introduction of the encapsulation material through the filling opening allows particularly simple and reliable delivery of the encapsulation material. For example, the encapsulation material may be introduced through the filling opening by means of a dispensing needle.

In one embodiment of the method, the optoelectronic semiconductor chip is embedded into the encapsulation material. The encapsulation material may therefore advantageously provide protection of the optoelectronic semiconductor chip. The encapsulation material may also be used as a reflector for electromagnetic radiation emitted by the optoelectronic semiconductor chip or to increase a contrast between a radiation emission face of the optoelectronic semiconductor chip and an environment of the optoelectronic semiconductor chip.

In one embodiment of the method, the optoelectronic semiconductor chip is not fully covered by the encapsulation material. Advantageously, this prevents electromagnetic radiation emitted by the optoelectronic semiconductor chip being shadowed or absorbed by the encapsulation material.

The above-described properties, features and advantages of this invention, as well as the way in which they are achieved, will become more clearly and readily comprehensible in conjunction with the following description of the exemplary embodiments, which will be explained in more detail in connection with the drawings, in which, respectively in a schematic representation:

FIG. 8 shows the carrier with frames arranged thereover according to a further embodiment;

FIG. 9 shows the carrier and the frames after introduction of an encapsulation material;

Figure 1:
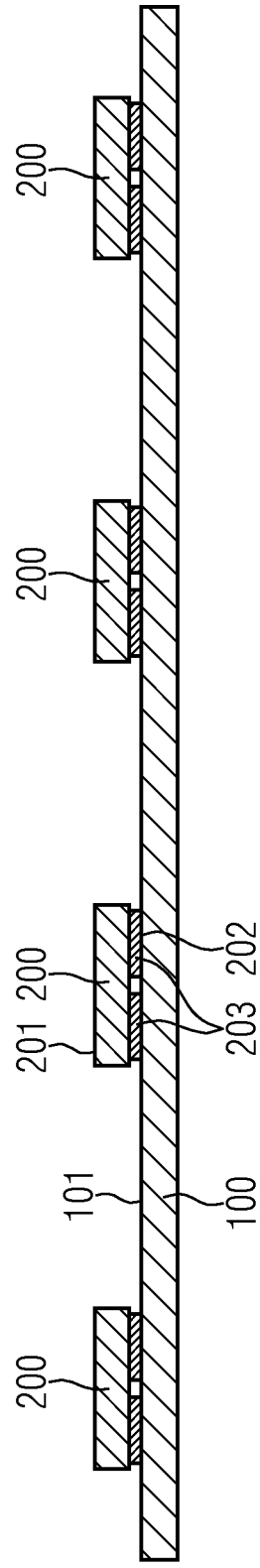
FIG. 1 shows a carrier with an optoelectronic semiconductor chip arranged on an upper side of the carrier.

FIG. 1 shows a schematic sectional side view of a carrier 100. In the example represented, the carrier 100 is formed as a board having a substantially planar upper side 101. The carrier 100 may also be referred to as a substrate. The carrier 100 may for example be formed as a printed circuit board (PCB), as a ceramic substrate or as a plastic substrate produced by a molding method.

A plurality of optoelectronic semiconductor chips 200 have been arranged on the upper side 101 of the carrier 100. The optoelectronic semiconductor chips 200 may, for example, have been arranged in a regular two-dimensional matrix arrangement on the upper side 101 of the carrier 100. The number of optoelectronic semiconductor chips 200 may be a few hundred or a few thousand. It is, however, also possible for only a single optoelectronic semiconductor chip 200 to be arranged on the upper side 101 of the carrier 100.

The optoelectronic semiconductor chips 200 may for example be configured to emit or detect electromagnetic radiation, for example visible light. Thus, the optoelectronic semiconductor chips 200 may for example be configured as light-emitting diode chips (LED chips), as laser chips, as photodiodes or as other optoelectronic semiconductor chips.

In the example represented, the optoelectronic semiconductor chips 200 arranged on the upper side 101 of the carrier 100 are all configured identically. It is, however, also possible to arrange a plurality of different optoelectronic semiconductor chips 200 on the upper side 101 of the carrier 100.

The optoelectronic semiconductor chips 200 respectively have an upper side 201 and a lower side 202 opposite the upper side 201. The optoelectronic semiconductor chips 200 have been arranged on the upper side 101 of the carrier 100 in such a way that the lower sides 202 of the optoelectronic semiconductor chips 200 face toward the upper side 101 of the carrier 100.

The upper side 201 of each optoelectronic semiconductor chip 200 may for example form a radiation emission face, at which electromagnetic radiation is emitted during operation of the optoelectronic semiconductor chip 200. If the optoelectronic semiconductor chips 200 are configured as light-detecting semiconductor chips, the optoelectronic semiconductor chips 200 may be configured to detect electromagnetic radiation incident on the upper side 201.

On their lower sides 202, in the example represented, the optoelectronic semiconductor chips 200 respectively have a plurality of electrical contact regions 203, for example respectively two electrical contact regions 203. The electrical contact regions 203 of the optoelectronic semiconductor chips 200 are electrically conductively connected, for example by means of solder connections or electrically conductive adhesive bonds, to electrical contact pads arranged on the upper side 101 of the carrier 100. In an alternative embodiment variant, one or more of the electrical contact regions 203 of the optoelectronic semiconductor chips 200 may be arranged on the upper sides 201 of the optoelectronic semiconductor chips 200. In this case, the electrical contact regions 203 of the optoelectronic semiconductor chips 200 may, for example, be connected by means of bond wire connections to electrical contact pads arranged on the upper side 101 of the carrier 100.

Figure 2:
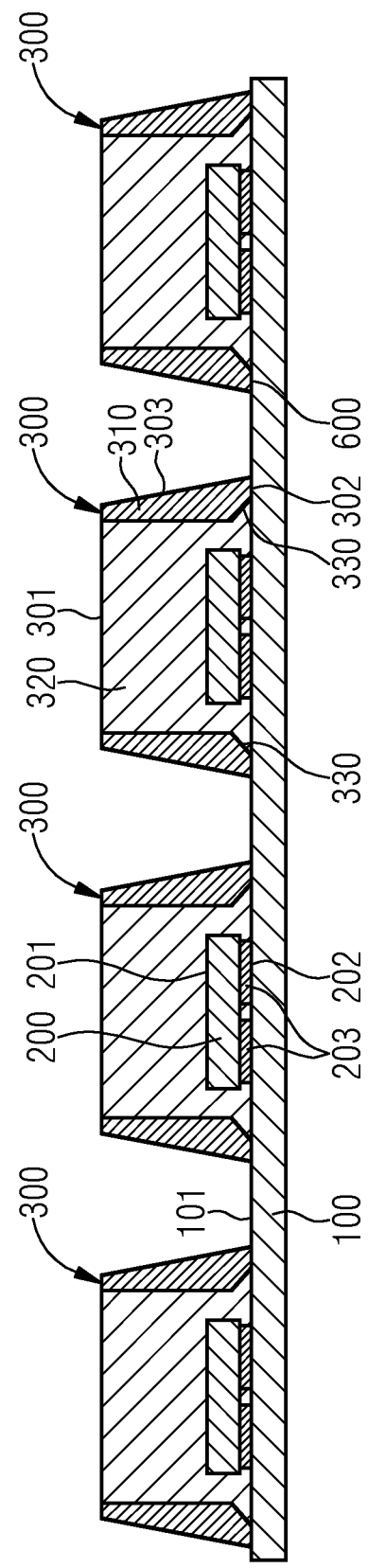
FIG. 2 shows the carrier with frames arranged thereon.

FIG. 2 shows a schematic sectional side view of the carrier 100 with optoelectronic semiconductor chips 200 arranged on the upper side 101, in a processing state chronologically following the representation of FIG. 1.

A plurality of frames 300 have been arranged on the upper side 101 of the carrier 100. The number of frames arranged on the upper side 101 of the carrier 100 corresponds to the number of optoelectronic semiconductor chips 200 arranged on the upper side 101 of the carrier 100, so that each optoelectronic semiconductor chip 200 is assigned precisely one frame 300. The frames 300 are all configured identically.

The frames 300 may for example be made from a plastic, for instance a polymer, from a ceramic, from a glass, from a metal or from a composite material. The frames 300 may, for example, be produced by a molding method.

Figure 3:
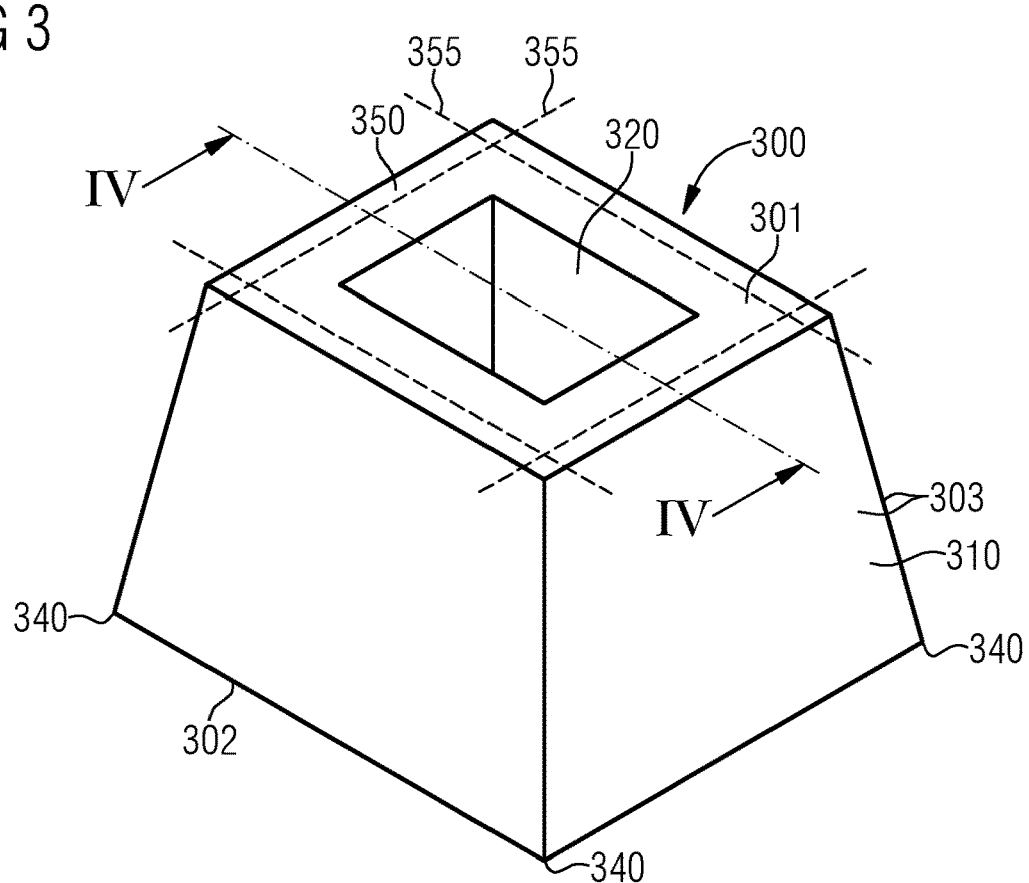
FIG. 3 shows a perspective view of one of the frames.
Figure 4:
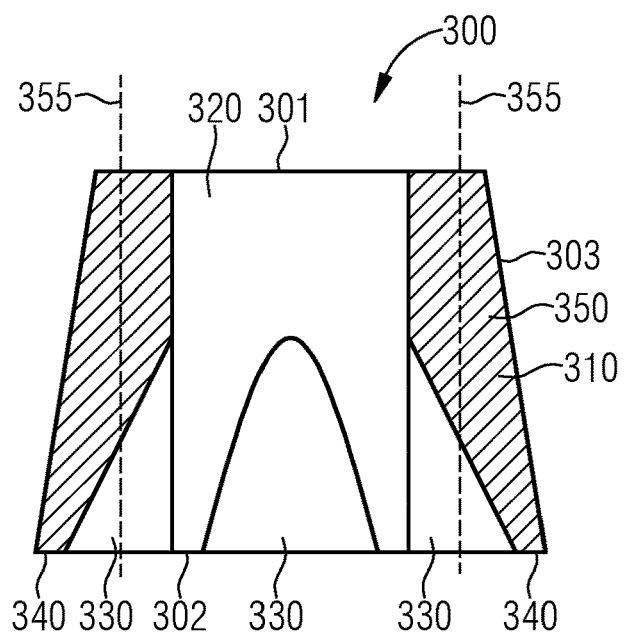
FIG. 4 shows a sectional side view of the frame.

FIG. 3 shows a schematic perspective representation of one of the frames 300, which will be described in more detail by way of example below. FIG. 4 shows a schematic sectional side view of the frame 300. In this case, the frame 300 is cut along a section plane indicated in FIG. 3.

The frame 300 has a tubular base shape with a rectangular cross section. An upper side 301 of the frame 300 forms a first longitudinal end of the tubular shape, a lower side 302 of the frame 300, opposite the upper side 301, forms the opposite longitudinal end of the tubular shape. The tubular frame 300 borders a spatial region 320, which may also be referred to as a cavity. The spatial region 320 bordered by the frame 300 is accessible on the upper side 301 and on the lower side 302 of the frame 300. The spatial region 320 bordered by the frame 300 is bounded by a wall 310, which has an outer side 303, of the frame 300.

In the represented example of the frame 300, the tubular wall 310 has a frustopyramidal outer contour. The lower side 302 of the frame 300 forms the base face of this pyramidal frustum. The upper side 301 of the frame 300 forms the top face of the pyramidal frustum and is smaller than the base face of the pyramidal frustum. In the example represented, both the base face and the top face of the pyramidal frustum are square. It is, however, also possible to configure the base face and the top face of the pyramidal frustum with a different rectangular or polygonal shape. It is likewise possible to configure the wall 310 of the frame 300 with a different outer contour, for example with the shape of a right prism. In this case, the upper side 301 of the frame 300 and the lower side 302 of the frame 300 are of equal size.

The inner contour of the wall 310 of the frame 300, i.e. of the spatial region 320 bordered by the frame 300, has a square base shape in the example represented. The inner contour of the wall 310 could, however, also be configured differently, for example as an arbitrary right prism or as a pyramidal frustum.

In addition to the base shape described, the frame 300 comprises at least one recess 330 on its lower side 302. In the example represented, the frame 300 comprises four recesses 330, a recess 330 respectively being formed at each inner edge of the wall 310 on the lower side 302. The recesses respectively extend between corner regions 340 of the lower side 302 of the frame 300, but respectively do not reach the corner regions 340 so that sections of the wall 310 remain without a recess 330 at the corner regions 340 on the lower side 302 of the frame 300. The surface of the wall 310 of the frame 300 facing toward the spatial region 320 bordered by the frame 300 is increased by the recesses 330.

It can be seen in FIG. 2 that the frames 300 have respectively been arranged on the upper side 101 of the carrier 100 in such a way that the lower side 302 of the frame 300 faces toward the upper side 101 of the carrier 100. In this case, the frames 300 have been arranged over the optoelectronic semiconductor chips 200 in such a way that each frame 300 borders the optoelectronic semiconductor chip 200 assigned to it. The optoelectronic semiconductor chip 200 is in this case respectively arranged in the spatial region 320 bordered by the respective frame 300.

The frames 300 may have been fastened on the upper side 101 of the carrier 100 by means of an adhesive 600. The adhesive 600 is in this case arranged in the regions in which the lower sides 302 of the frames 300 bear on the upper side 101 of the carrier 100. This means that no adhesive 600 must be arranged on the upper side 101 of the carrier 100 in the region of the recesses 330 of the frames 300. It is also possible to provide the adhesive 600 only in the corner regions 360 of the frames 300. The regions of the upper side 101 of the carrier 100 which lie below the recesses 330 of the frames 300 may therefore be used for other purposes. For example, electrical conductor tracks or electrical contact pads arranged on the upper side 101 of the carrier 100 may extend into these sections of the upper side 101 of the carrier 100.

Figure 5:
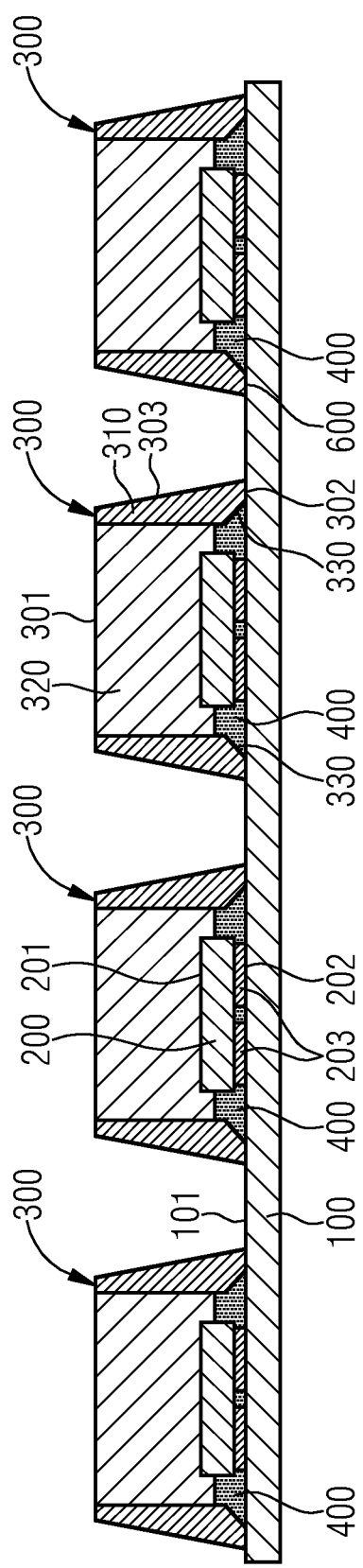
FIG. 5 shows the carrier after an encapsulation material has been arranged in the frames.

FIG. 5 shows a schematic sectional side view of the carrier 100, of the optoelectronic semiconductor chips 200 arranged on the upper side 101 of the carrier 100, and of the frames 300 arranged on the upper side 101 of the carrier 100, in a processing state chronologically following the representation of FIG. 2.

An encapsulation material 400 has been arranged on the upper side 101 of the carrier 100 in the spatial regions 320 bordered by the frames 300. The encapsulation material 400 may, for example, have been arranged individually in each of the frames 300 by means of a needle dispensing method. To this end, the encapsulation material 400 may for example have been introduced on the upper sides 301 of the frames 300 by means of a dispensing needle. As an alternative, all the frames 300 arranged on the upper side 101 of the carrier 100 may also be filled simultaneously with the encapsulation material 400. This may, for example, be carried out in such a way that the encapsulation material 400 is also arranged on the upper side 101 of the carrier 100 between the frames 300. The carrier 100 may in this case comprise a circumferential edge on its upper side 101, which prevents the encapsulation material 400 flowing away.

The encapsulation material 400 has been arranged on the upper side 101 of the carrier 100 in the spatial regions 320 bordered by the frames 300 in such a way that the encapsulation material 400 is respectively in contact with the frame 300 and at least partially fills the recesses 330 on the lower sides 302 of the frames 300. In the example represented, the recesses 330 on the lower sides 302 of the frames 300 have been fully filled by the encapsulation material 400. For each frame 300, the encapsulation material 400 is therefore in contact with the wall 310 of the frame 300 in the region of the recesses 300. Furthermore, the encapsulation material 400 is in contact with the upper side 101 of the carrier 100.

The optoelectronic semiconductor chips 200 have been partially embedded into the encapsulation material 400. In this case, in the example represented, the upper sides 201 of the optoelectronic semiconductor chips 200 have not been covered by the encapsulation material 400 but have remained uncovered. It is, however, also possible to introduce so great an amount of the encapsulation material 400 into each frame 300 that the optoelectronic semiconductor chips 200 arranged in the spatial regions 320 bordered by the frames 300 are fully embedded into the encapsulation material 400.

The encapsulation material 400 may, for example, comprise a silicone. In addition, the encapsulation material 400 may comprise embedded particles. For example, the encapsulation material 400 may comprise light-reflecting particles, for example $TiO_2$ particles. In this case, the encapsulation material 400 arranged in the frames 300 may be used as a reflector for electromagnetic radiation emitted by the optoelectronic semiconductor chips 200. The encapsulation material 400 may also comprise embedded light-absorbing particles, for example carbon black particles. In this case, the encapsulation material 400 arranged in the frames 300 may be used to increase an optical contrast between the light-emitting upper side 201 of the respective optoelectronic semiconductor chip 200 and the environment of the upper side 201 of the optoelectronic semiconductor chip 200. The encapsulation material 400 may also comprise other embedded particles, for example particles which are used to adapt a thermal conductivity of the encapsulation material 400 or a thermal expansion coefficient of the encapsulation material 400.

After the introduction of the encapsulation material 400, a further processing step may have been carried out in order to cure the encapsulation material 400. The curing may, for example, have been carried out by a heat treatment or by UV irradiation.

Figure 6:
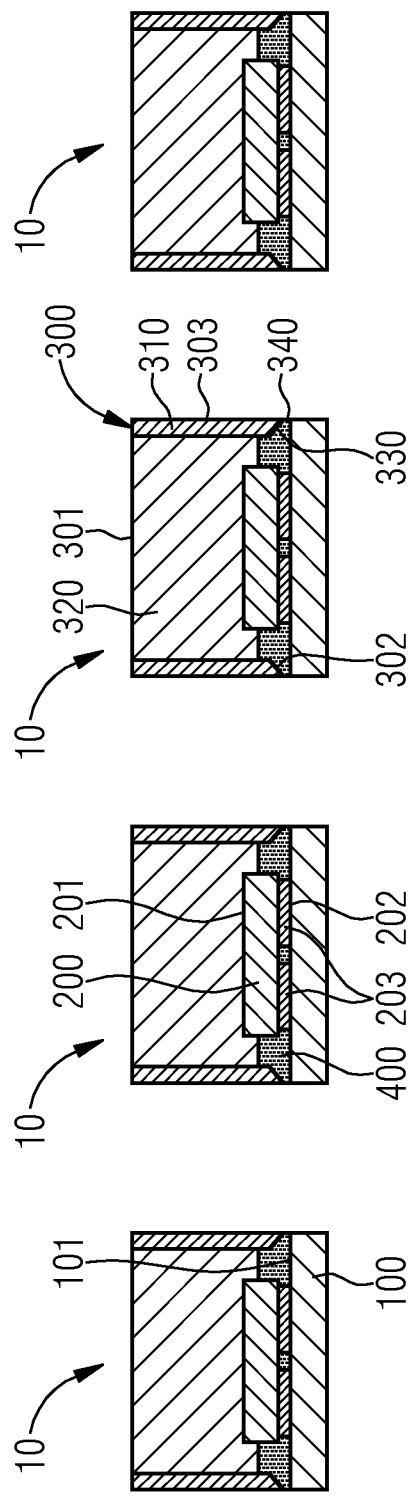
FIG. 6 shows a plurality of optoelectronic components obtained by division of the carrier and of the frames.

FIG. 6 shows a schematic sectional side view of a plurality of optoelectronic components 10 which have been obtained by further processing of the arrangement shown in FIG. 5.

The carrier 100 with the optoelectronic semiconductor chips 200 and frames 300 arranged thereon has been divided in such a way that each part obtained comprises one of the optoelectronic semiconductor chips 200 and one of the frames 300. Each part singulated in this way forms an optoelectronic component 10. The division may, for example, have been carried out by means of a sawing process.

Figure 7:
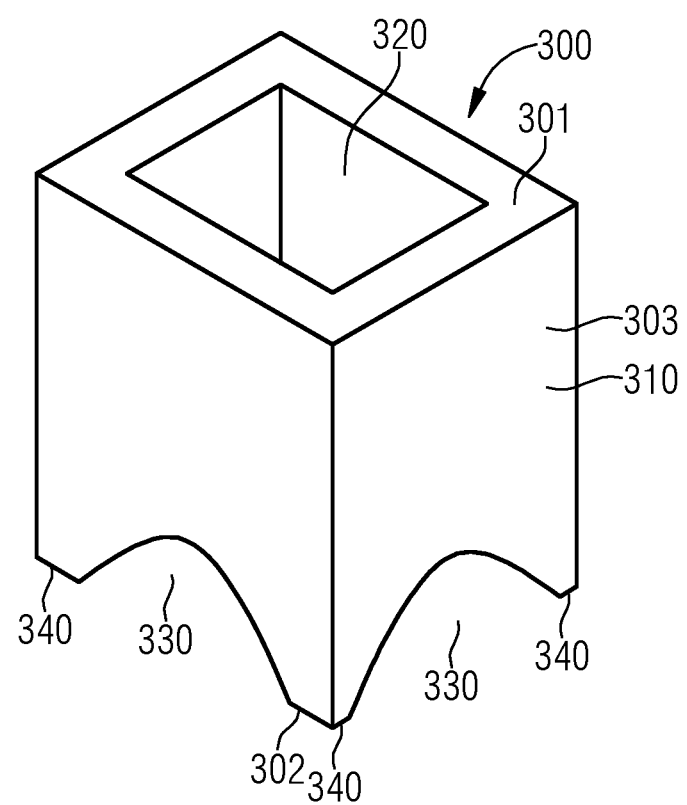
FIG. 7 shows one of the frames after the division.

During the division of the carrier 100 in order to singulate the optoelectronic components 10, the frames 300 have also been divided. In this case, each frame 300 has been cut through at separating regions 355 schematically shown in FIG. 4 in order to separate parts 350, shown in FIG. 4, of the frames 300. The separating regions 355 extend through the walls 310 of the frames 300 in a direction perpendicular to the upper side 101 of the carrier 100. By the removal of the parts 350 of the frames 300, the frames 300 are thinned and the outer sides 303 of the frames 300 are modified. FIG. 7 shows a schematic perspective representation of one of the frames 300 after the removal of the parts 350. In this case, the carrier 100 and the encapsulation material 400 are not represented for the sake of clarity.

The separating regions 355 also extend through the recesses 330 of the frames 300. The removed parts 350 of the frames 300 therefore also comprise sections of the lower sides 302, in contact with the upper side 101 of the carrier 100, of the frames 300, which sections may have been connected to the upper side 101 of the carrier 100 by means of the adhesive 600. Then, for each frame 300, the area of the parts, connected by means of the adhesive 600 to the upper side 101 of the carrier 100, of the lower side 302 of the frame 300 has been reduced after the removal of the parts 350 of the frame 300. In the example shown in the figures, the adhesive 600 is arranged between the lower side 302 of the frame 300 and the upper side 101 of the carrier 100 only in the corner regions 340 of each frame 300. This is possible since the encapsulation material 400 in contact with the frame 300 and with the carrier 100 achieves additional fixing of the frame 300 on the carrier 100.

Since the separating regions 355 for each frame 300 extended through the recesses 330 on the lower side 302 of the frame 300, cutouts 335 have respectively been formed between the spatial region 320 bordered by the frame 300 and the outer side 303 of the frame 300 by the removal of the parts 350 of the frame 300 in the region of the recesses 330. These cutouts 335 are fully filled with the encapsulation material 400 in the example represented.

In a simplified variant of the described production method, the division of the frames 300 and the removal of the parts 350 of the frames 300 are omitted.

FIG. 8 shows a schematic representation of a processing state which corresponds to the situation shown in FIG. 2. In this case, however, the frames 300 arranged on the upper side 101 of the carrier 100 are configured according to an alternative variant. In the variant shown in FIG. 8, each frame 300 together with further frames 300 of the same type forms an integrally connected panel 500. Each such panel 500 may, for example, comprise two or more frames 300. One or more such panels 500 of frames 300 may be arranged on the upper side 101 of the carrier 100. In the schematic representation of FIG. 8, two panels 500, which respectively comprise two frames 300, are provided.

In each panel 500 of frames 300, the spatial regions 320 bordered by the individual frames 300 are connected to one another by flow openings 510. The flow openings 510 extend on the lower sides 302 of the frames 300 from one frame 300 to the next frame 300. In the frames 300 arranged on the upper side 101 of the carrier 100, the flow openings 510 are open toward the upper side 101 of the carrier 100. The flow openings 510 may, for example, connect with the recesses 330 on the lower sides 302 of the frames 300.

FIG. 9 shows a schematic sectional side view of the carrier 100, of the optoelectronic semiconductor chips 200 arranged on the upper side 101 of the carrier 100, and of the panels 500 of frames 300 arranged on the upper side 101 of the carrier 100, in a processing state chronologically following the representation of FIG. 8.

An encapsulation material 400 has been arranged in the spatial regions 320 bordered by the frames 300 on the upper side 101 of the carrier 100, as already described with the aid of FIG. 5. The panels 500 of frames 300 have, however, made it possible for the encapsulation material 400 to be introduced in each panel 500 into all the frames 300 of the respective panel 500 in a single working step. The encapsulation material 400 may in this case have flowed through the flow openings 510 of the panel 500 from one frame 300 to the next frame 300 of the panel 500. For example, the encapsulation material 400 may have been introduced into one of the frames 300 of the panel 500 and flowed through the flow openings 510 into all further frames 300 of the panel 500.

Starting from the processing state shown in FIG. 9, the further processing as explained with the aid of FIGS. 5 and 6 is carried out. In this case, during the division of the frames 300 at the separating regions 355, the flow openings 510 between the individual frames 300 of each panel 500 are also separated from the frames 300 and the frames 300 are singulated.

Figure 10:
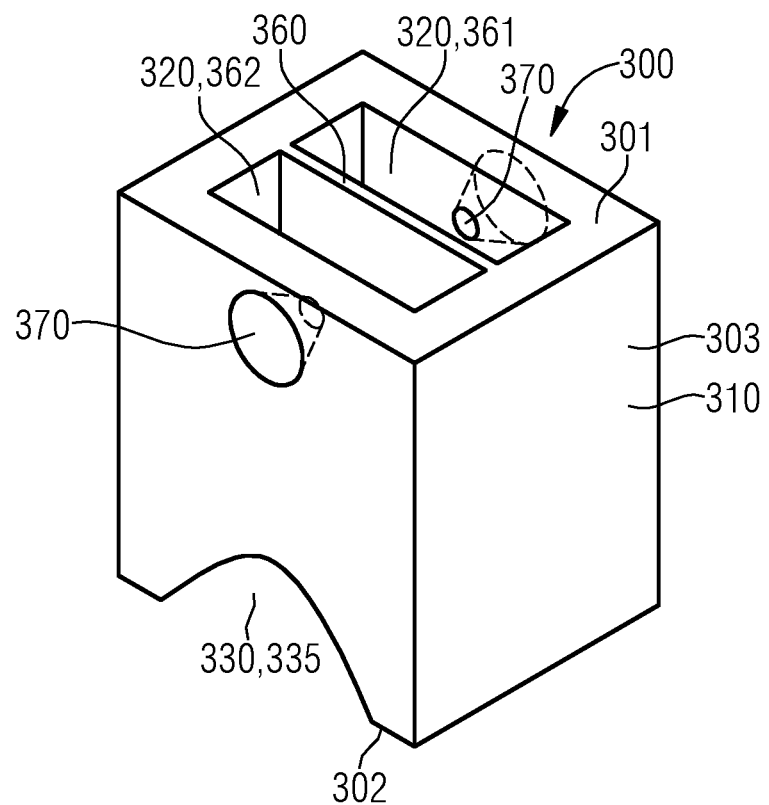
FIG. 10 shows a perspective view of a frame according to a further embodiment.

FIG. 10 shows a schematic perspective representation of a frame 300 according to an alternative variant. The processing state, shown in FIG. 10, of the frame 300 corresponds to the processing state of FIG. 7 after the removal of parts 350 of the frame 300. Before the removal of the parts 350 of the frame 300, the variant of the frame 300 as shown in FIG. 10 may have been configured as an individual frame in the sense of FIGS. 1 to 7 or as part of a panel 500 in the sense of FIGS. 8 and 9.

The variant of the frame 300 as shown in FIG. 10 differs from the variant of the frame 300 as shown in FIG. 7 in that it comprises an intermediate wall 360 which subdivides the spatial region 320 bordered by the frame 300 into a first partial space 361 and a second partial space 362. The intermediate wall 360 extends parallel to the tubular wall 310 of the frame 300 between one section of the wall 310 and an opposite section of the wall 310, as well as between the upper side 301 and the lower side 302 of the frame 300. In the example represented, the first partial space 361 and the second partial space 362 have the same size. It is, however, also possible to configure the first partial space 361 and the second partial space 362 with different sizes. Further intermediate walls 360, which subdivide the spatial region 320 bordered by the frame 300 into a larger number of partial spaces 361, 362, may likewise be provided.

The variant of the frame 300 as shown in FIG. 10 may, for example, be used to produce an optoelectronic component 10 which comprises a plurality of optoelectronic semiconductor chips 200. In this case, the frame 300 is arranged on the upper side 101 of the carrier 100 in such a way that a separate optoelectronic semiconductor chip 200 is arranged in each partial space 361, 362 of the spatial region 320 bordered by the frame 300. In this case, different or identical optoelectronic semiconductor chips 200 may be arranged in the partial spaces 361, 362.

In the variant of the frame 300 as shown in FIG. 10, there are only two recesses 330, which are arranged on the two sections of the wall 310 of the frame 300 that the intermediate wall 360 does not meet. After the removal of the parts 350 of the frame 300, the recesses 330 form cutouts 335 respectively between a partial space 361, 362 and the outer side 303 of the frame 300.

The variant of the frame 300 as shown in FIG. 10 comprises two filling openings 370. Each of the filling openings 370 extends respectively from the outer side 303 of the frame 300 through the wall 310 to the spatial region 320 bordered by the frame 300. In this case, one of the filling openings 370 in the example shown extends to the first partial space 361, while the second filling opening 370 extends to the second partial space 362. In the example represented, the filling openings 370 have a conical shape which tapers from the outer side 303 to the spatial region 320 bordered by the frame 300. It is, however, also possible to configure the filling openings 370 with a cylindrical shape or a different shape.

The filling openings 370 are intended for introducing the encapsulation material 400 into the spatial region 320 bordered by the frame 300. To this end, for example, a dispensing needle may be arranged in the filling openings 370 in order to introduce the encapsulation material 400 through the respective filling opening 370 into the spatial region 320 bordered by the frame 300. Since, in the variant of the frame 300 as shown in FIG. 10, each partial space 361, 362 of the spatial region 320 bordered by the frame 300 has its own filling opening 370, it is possible to fill the two partial spaces 361, 362 with the encapsulation material 400 separately from one another. This makes it possible to fill the two partial spaces 361, 362 of the spatial region 320 bordered by the frame 300 with different encapsulation materials 400, if this is required. Different encapsulation materials 400 may, for example, be expedient if different optoelectronic semiconductor chips 200 are arranged in the partial spaces 361, 362 of the frame 300.

In further variants of the frame 300, the filling openings 370 shown in FIG. 10 may be omitted. In these variants, the partial spaces 361, 362 of the spatial region 320 bordered by the frame 300 may be filled with the encapsulation material 400 through the openings on the upper side 301 of the frame 300. In further variants of the frame 300, it does not have an intermediate wall 360, so that the spatial region 320 bordered by the frame 300 is not subdivided into partial spaces 361, 362. In such variants as well, there may be a filling opening 370 for filling the spatial region 320 bordered by the frame 300 with the encapsulation material 400. Even in the case of a frame 300 equipped with an intermediate wall 360, it is possible to provide recesses 330 on the lower side 302 of the frame 300 on all sides of the wall 310, as described with the aid of FIGS. 1 to 7. Conversely, in the case of a frame 300 without an intermediate wall 360, it is also possible for there to be only two or fewer recesses 330, as is represented in FIG. 10.

Figure 11:
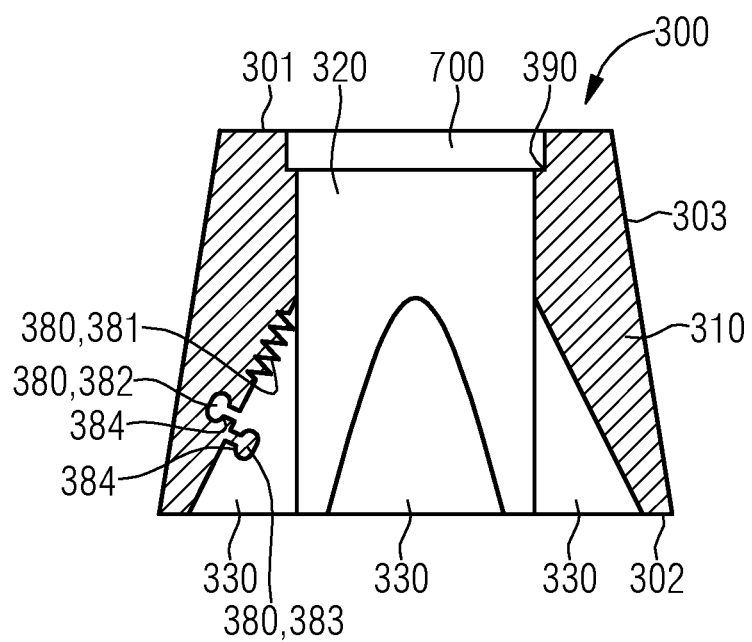
FIG. 11 shows a sectional side view of a frame according to a further embodiment.

FIG. 11 shows a schematic sectional side view of a further variant of the frame 300. The processing state of the frame 300 as shown in FIG. 11 is similar to the processing state of the frame 300 as shown in FIG. 4. The specific features, described below with the aid of FIG. 11, of the variant of the frame 300 as shown in FIG. 11 may also be present individually or in combination with one another in the variants of the frame 300 as described above with the aid of FIGS. 1 to 10.

In the variant of the frame 300 as shown in FIG. 11, an anchoring structure 380 is provided on the surface of the wall 310 facing toward the spatial region 320 bordered by the frame 300. In the example represented, the anchoring structure 380 is arranged in the region of a recess 330. As an alternative or in addition, however, the anchoring structure 380 could also be present in other sections of the wall 310 which face toward the spatial region 320 bordered by the frame 300. The anchoring structure 380 is intended to anchor the encapsulation material 400 arranged in the frame 300 particularly firmly on the frame 300 during the production of the optoelectronic component 10. By the anchoring structure 380, the connection between the encapsulation material 400 and the wall 310 of the frame 300 is thus reinforced. In this way, the encapsulation material 400 may achieve even more effective fixing of the frame 300 on the upper side 101 of the carrier 100.

In the example represented, the anchoring structure 380 comprises roughening 381, an indentation 382 and a projection 383. The indentation 382 and the projection 383 are in this case respectively configured so that they comprise an undercut 384, by which particularly effective anchoring of the encapsulation material 400 on the wall 310 of the frame 300 is achieved. The indentation 382 and/or the projection 383 could, however, also be configured differently. In another variants of the frame 300, the anchoring structure 380 may comprise only roughening 381, only one or more indentations 382 or only one or more projections 383. The anchoring structure 380 may also comprise other suitable structures.

In addition, the frame 300 of the variant shown in FIG. 11 comprises a mount 390 on its upper side 301. The mount 390 is configured as a step in the wall 310 at the opening of the spatial region 320 bordered by the frame 300 on the upper side 301 of the frame 300.

In the example represented, an optical element 700 is mounted in the mount 390. During the production of the optoelectronic component 10, the optical element 700 may already be mounted in the mount 390 of the frame 300 before the frame 300 is arranged on the upper side 101 of the carrier 100. As an alternative, however, the optical element 700 may not be arranged in the mount 390 of the frame 300 until a later time, for example after the introduction of the encapsulation material 400 or after the singulation of the optoelectronic component 10.

The optical element 700 may for example be a Fresnel optical element, a diffractive optical element, a metaoptical element, an optical lens or a combination of a plurality of such optical elements.

The frame 300 could also comprise a plurality of mounts 390 for a plurality of optical elements. The mounts 390 may also be configured differently than in the example shown.

In addition, the frame 300 could also comprise further elements and/or structures which are embedded and/or fastened thereon. Instead of the optical element 700, a simple window without an optical function may also be provided.

Besides one or more optoelectronic semiconductor chips 200, the optoelectronic component 10 may also comprise further constituent elements, for example other semiconductor chips. For example, the optoelectronic component 10 may comprise protective diodes and/or control chips.

The invention has been illustrated and described in detail with the aid of the preferred exemplary embodiments. The invention is not, however, restricted to the examples disclosed. Rather, other variants may be derived therefrom by the person skilled in the art, without departing from the protective scope of the invention.

LIST OF REFERENCES 10 optoelectronic component
100 carrier
101 upper side
200 optoelectronic semiconductor chip
201 upper side
202 lower side
203 electrical contact region
300 frame
301 upper side
302 lower side
303 outer side
310 wall
320 spatial region bordered by the frame (cavity)
330 recess
335 cutout
340 corner region
350 part of the frame
355 separating region
360 intermediate wall
361 first partial space
362 second partial space
370 filling opening
380 anchoring structure
381 roughening
382 indentation
383 projection
384 undercut
390 mount
400 encapsulation material
500 panel
510 flow opening
600 adhesive
700 optical element

The invention claimed is:

1. An optoelectronic component
having a carrier,
having an optoelectronic semiconductor chip arranged on an upper side of the carrier,
having a frame, which is arranged on the upper side of the carrier and borders the optoelectronic semiconductor chip,
wherein a lower side, facing toward the upper side of the carrier, of the frame comprises at least one recess,
wherein the lower side of the frame is fastened on the upper side of the carrier by means of an adhesive,
and having an encapsulation material, which is arranged in a spatial region, bordered by the frame, on the upper side of the carrier, is in contact with the frame and at least partially fills the recess of the frame.

2. The optoelectronic component according to claim 1, wherein the recess forms an aperture between the spatial region bordered by the frame and an outer side of the frame.

3. The optoelectronic component according to claim 1, wherein no adhesive is arranged in a region of the recess of the frame.

4. The optoelectronic component according to claim 3, wherein the frame is fastened on the upper side of the carrier by means of the adhesive only in four corner regions of the frame.

5. The optoelectronic component according to claim 1, wherein the frame comprises an anchoring structure, by which the encapsulation material is anchored on the frame,
wherein the anchoring structure comprises roughening, an indentation or a projection, in particular an indentation or a projection having an undercut.

6. The optoelectronic component according to claim 1, wherein an optical element is mounted on the frame.

7. The optoelectronic component according to claim 1, wherein the frame comprises a filling opening, which extends from an outer side of the frame through a wall of the frame to the spatial region bordered by the frame.

8. The optoelectronic component according to claim 1, wherein the optoelectronic semiconductor chip is embedded into the encapsulation material.

9. The optoelectronic component according to claim 8, wherein the optoelectronic semiconductor chip is not fully covered by the encapsulation material.

10. The optoelectronic component according to claim 1, wherein the frame comprises an intermediate wall, which subdivides the spatial region bordered by the frame.

11. The optoelectronic component according to claim 10, wherein a different encapsulation material is arranged in one part of the spatial region bordered by the frame than in another part of the spatial region bordered by the frame.

12. A method for producing an optoelectronic component, having the following steps:
arranging an optoelectronic semiconductor chip on an upper side of a carrier;
providing a frame having a lower side which comprises a recess;
arranging the frame on the upper side of the carrier in such a way that the lower side of the frame faces toward the upper side of the carrier and the frame borders the optoelectronic semiconductor chip, the lower side of the frame being fastened on the upper side of the carrier by means of an adhesive;
arranging an encapsulation material in a spatial region, bordered by the frame, on the upper side of the carrier in such a way that the encapsulation material is in contact with the frame and at least partially fills the recess of the frame.

13. The method according to claim 12, wherein the method comprises the following further step:
removing a part of the frame.

14. The method according to claim 13, wherein the part of the frame is removed in such a way that a cutout is formed between the spatial region bordered by the frame and an outer side of the frame in a region of the recess.

15. The method according to claim 13, wherein the frame is provided as a panel comprising further frames, the panel being divided after the encapsulation material has been arranged.

16. The method according to claim 12, wherein no adhesive is arranged in a region of the recess of the frame.

17. The method according to claim 16, wherein the frame is fastened on the upper side of the carrier by means of the adhesive only in four corner regions of the frame.

18. The method according to claim 12, wherein the frame comprises a filling opening, which extends from an outer side of the frame through a wall of the frame to the spatial region bordered by the frame,
wherein the encapsulation material is delivered through the filling opening.

19. The method according to claim 12, wherein the optoelectronic semiconductor chip is embedded into the encapsulation material.

20. The method according to claim 19, wherein the optoelectronic semiconductor chip is not fully covered by the encapsulation material.

21. An optoelectronic component, comprising:
a carrier;
an optoelectronic semiconductor chip arranged on an upper side of the carrier;
a frame, which is arranged on the upper side of the carrier and borders the optoelectronic semiconductor chip; and
an encapsulation material, which is arranged in a spatial region, bordered by the frame, on the upper side of the carrier, is in contact with the frame and at least partially fills at least one recess of the frame;
wherein:
a lower side, facing toward the upper side of the carrier, of the frame comprises the at least one recess;
the lower side of the frame is fastened on the upper side of the carrier by means of an adhesive; and
the at least one recess forms an aperture between the spatial region bordered by the frame and an outer side of the frame.

22. An optoelectronic component, comprising:
a carrier;
an optoelectronic semiconductor chip arranged on an upper side of the carrier;
a frame, which is arranged on the upper side of the carrier and borders the optoelectronic semiconductor chip; and
an encapsulation material, which is arranged in a spatial region, bordered by the frame, on the upper side of the carrier, is in contact with the frame and at least partially fills at least one recess of the frame;
wherein:
a lower side, facing toward the upper side of the carrier, of the frame comprises the at least one recess;
the lower side of the frame is fastened on the upper side of the carrier by means of an adhesive;
the optoelectronic semiconductor chip is embedded into the encapsulation material; and
the optoelectronic semiconductor chip is not fully covered by the encapsulation material.

* * * * *